US011735356B2

(12) United States Patent
Kipp

(10) Patent No.: US 11,735,356 B2
(45) Date of Patent: Aug. 22, 2023

(54) CURRENT CONVERTER WITH FLUID OR OIL PAPER INSULATION FOR HIGH VOLTAGE

(71) Applicant: RITZ Instrument Transformers GmbH, Hamburg (DE)

(72) Inventor: Herbert Kipp, Reeßum/Taaken (DE)

(73) Assignee: RITZ Instrument Transformers GmbH, Hamburg (DE)

( * ) Notice: Subject to any disclaimer, the term of this patent is extended or adjusted under 35 U.S.C. 154(b) by 532 days.

(21) Appl. No.: 16/757,346

(22) PCT Filed: Oct. 19, 2018

(86) PCT No.: PCT/EP2018/078683
§ 371 (c)(1),
(2) Date: Apr. 17, 2020

(87) PCT Pub. No.: WO2019/077096
PCT Pub. Date: Apr. 25, 2019

(65) Prior Publication Data
US 2021/0193375 A1    Jun. 24, 2021

(30) Foreign Application Priority Data
Oct. 19, 2017   (EP) .................................... 17197302

(51) Int. Cl.
*H01F 27/32*     (2006.01)
*H01F 27/28*     (2006.01)
*H01F 38/30*     (2006.01)

(52) U.S. Cl.
CPC ....... *H01F 27/321* (2013.01); *H01F 27/2823* (2013.01); *H01F 38/30* (2013.01)

(58) Field of Classification Search
CPC .... H01F 27/321; H01F 27/2823; H01F 38/28; H01F 38/30

(Continued)

(56) References Cited

U.S. PATENT DOCUMENTS 4,527,140 A * 7/1985 Kimura ................... H01F 38/30
                                                    336/175
4,731,599 A * 3/1988 Preissinger ............. H01F 38/36
                                                    336/107
(Continued)

FOREIGN PATENT DOCUMENTS

CN       202076117 U   * 12/2011
CN       103117161 A   *  5/2013
(Continued)

OTHER PUBLICATIONS

International Preliminary Report of Patentability dated Apr. 21, 2020, directed to International Application No. PCT/EP2018/078683; 5 pages.

(Continued)

*Primary Examiner* — Mang Tin Bik Lian
*Assistant Examiner* — Joselito S. Baisa
(74) *Attorney, Agent, or Firm* — Morrison & Foerster LLP

(57) ABSTRACT

A current converter with fluid or oil paper insulation for high voltage, with a head housing through which a primary conductor passes. A measurement device through which the primary conductor passes is arranged in the head housing. The primary conductor includes two different primary conductor types, more specifically an outer tube primary conductor as the first type and one or more inner conductor primary conductors as the second type. The outer tube primary conductor surrounds an interior that is designed to receive the inner conductor primary conductor, and the inner conductor primary conductors can be inserted into the interior. The outer tube primary conductor is used to transmit power and creates an encasement for the inner conductors. Only the outer tube primary conductor needs to be sealed with respect to the head housing. Inner conductors therefore (Continued)

can be easily inserted or re-moved subsequently, without the need for sealing measures.

15 Claims, 5 Drawing Sheets

(58) Field of Classification Search
USPC ...................................... 336/222, 57, 58, 94
See application file for complete search history.

(56) References Cited

U.S. PATENT DOCUMENTS

| | | | | |
|---|---|---|---|---|
| 4,868,533 | A * | 9/1989 | Ehrenhalt | H01F 27/2871 336/229 |
| 7,119,648 | B1 * | 10/2006 | Herbert | H01F 30/06 363/24 |
| 8,269,592 | B1 * | 9/2012 | McCauley, IV | H01F 27/28 336/195 |
| 9,287,035 | B2 * | 3/2016 | Park | H02M 3/28 |
| 9,419,530 | B2 * | 8/2016 | Park | H02M 3/33523 |
| 10,102,962 | B1 * | 10/2018 | Cappabianca | H01F 17/06 |
| 11,605,501 | B2 * | 3/2023 | Banaszczyk | H01F 41/06 |
| 2014/0340938 | A1 * | 11/2014 | Park | H01F 27/2823 363/15 |
| 2017/0186532 | A1 * | 6/2017 | Breder | H01F 27/321 |

FOREIGN PATENT DOCUMENTS

| | | | | |
|---|---|---|---|---|
| CN | 107294030 | A * | 10/2017 | |
| DE | 10013143 | A1 * | 10/2001 | ........... G01R 15/183 |
| EP | 2592636 | A2 * | 5/2013 | ............. H01F 27/28 |
| EP | 3208816 | A1 * | 8/2017 | |
| WO | 2017/021248 | A1 | 2/2017 | |
| WO | WO-2017021248 | A1 * | 2/2017 | ........... G01R 15/183 |
| WO | 2019/077096 | A1 | 4/2019 | |

OTHER PUBLICATIONS

International Search Report dated Nov. 15, 2018, for PCT Patent Application No. PCT/EP2018/078683 filed on Oct. 19, 2018, 6 pages.

* cited by examiner

CURRENT CONVERTER WITH FLUID OR OIL PAPER INSULATION FOR HIGH VOLTAGE

CROSS-REFERENCE TO RELATED APPLICATIONS

This application is a U.S. national stage patent application of International Patent Application No. PCT/EP2018/078683, filed on Oct. 19, 2018, which claims priority of EP 17197302.7, filed on Oct. 19, 2017, the entire contents of each of which are incorporated herein by reference.

FIELD OF THE DISCLOSURE

The invention relates to a current transformer (combined transformer) with fluid or oil paper insulation for a high voltage, having a head housing that is passed through by a primary conductor, wherein a measurement device penetrated by the primary conductor and having a measuring core arranged in a protective sleeve is arranged in the head housing.

BACKGROUND OF THE DISCLOSURE

For the operation of energy transmission grids, there is often a need to measure currents in the high-voltage system. This applies to various applications, in particular to the operation of the grid itself, to consumer connections or also to connections of generators. Due to these different applications, high scalability with regard to the current measurement range is therefore expected from the current measurement devices (current transformers).

Current transformers for high-voltage systems with contactless measurement have been known for a long time. In this case, a primary conductor channeling the current at a high voltage level is guided centrally through a toroidal measurement device. In order to expand the current measurement range, the primary conductor may be designed with multiple strands, often with four parallel strands. In this case, the strands are guided mechanically in parallel through the toroidal measurement device. The strands may be selectively electrically connected in series (with external feedback) or connected in parallel. By connecting the strands in series, the current measurement range is able to be expanded downward, and, by virtue of a parallel connection, the current measurement range is able to be expanded upward.

In order to avoid flashovers, high-voltage transformers are generally usually insulated by way of fluid and/or oil paper insulation. In the case of a multi-strand design of the primary conductor, this leads to the disadvantage that it is necessary to pass multiple times through the interior, which is insulated by way of fluid and/or oil paper insulation. This requires a large number of seals. In most cases, two seals must be provided for each strand (at the entrance and at the exit). This is complex and is usually able to be performed only in the factory during manufacture. Subsequent adaptation to a changed current measurement range by adding additional strands is therefore hardly possible.

SUMMARY OF THE DISCLOSURE

An object of the invention, according to various embodiments, is therefore to improve current transformers for high-voltage systems in such a way that they are able to be better adapted with less effort.

According to some embodiments, in a current transformer with fluid or oil paper insulation for a high voltage, having a head housing that is passed through by a primary conductor, wherein a measuring device penetrated by the primary conductor is arranged in the head housing, there is provision according to the invention that the primary conductor comprises two different types, specifically an outer tube primary conductor as the first type and one or more inner conductor primary conductors as the second type, wherein the outer tube primary conductor encloses an interior that is designed to receive the inner conductor primary conductors, and the inner conductor primary conductors are able to be inserted into the interior.

According to various embodiments, the outer tube is used to create a special primary conductor that firstly serves for power transmission and secondly creates a sheath for the inner conductors. The inventors recognized that only the outer tube primary conductor therefore has to be sealed off from the head housing, and therefore inner conductors are able to be subsequently inserted or removed without problems, without having to worry about sealing measures. According to embodiments of the invention, a special combination is thus created in which the outer tube, which acts as a protective sheath, is also the primary conductor.

Subsequent changes to the configuration and number of primary conductors are therefore easily possible. Furthermore, the number of seals is reduced to two (one each at the beginning and end of the outer tube primary conductor) compared to two per strand (that was a total of eight seals in the common design with four conductor strands), which not only means a reduction in manufacturing effort but also entails an increase in reliability.

According to various embodiments, the invention also has the advantage that the inner conductors are not in direct contact with the head housing and are therefore better thermally insulated, as a result of which the heating—which is undesirable per se—of the current transformer and in particular of its measurement device, caused by unavoidable current heat losses in the primary conductors, is minimized.

A fluid is understood to mean gas, for example sulfur hexafluoride SF6, or liquid, for example oil.

A plurality of reception pockets are expediently formed in the interior, which reception pockets position the inner conductor primary conductor or conductors in the interior. This defines the positioning of the inner conductor primary conductors such that they are easily able to be inserted into the reception pocket when necessary. No further measures are required to correctly receive or position the inner conductor primary conductors. Spacers are preferably provided for the reception pockets. This also automatically results in the inner conductor primary conductors being correctly positioned when they are inserted. It is particularly expedient if the spacers are integrated into the reception pocket, such that no additional components are required. It is thus made much easier to retrofit the current transformer according to the invention with further inner conductor primary conductors. The inner conductor primary conductors are preferably designed to be air-insulated.

The inner conductor primary conductors are preferably arranged uniformly distributed in the circumferential direction. This offers a maximum distance between the individual primary conductors, which is beneficial, particularly in the case of a series connection, for potential differences that occur between the inner conductor primary conductors. This furthermore results in beneficial courses for the field lines of the electrical and magnetic fields. An arrangement of three inner conductor primary conductors at corners of a triangle, in particular a right-angled and isosceles triangle, is particularly expedient.

The outer tube primary conductor is preferably guided into the head housing in a manner insulated on only one side and screwed conductively to the head housing from the opposite side via a contact base plate. Furthermore, it is expedient if the inner conductor primary conductor or conductors are insulated from the outer tube primary conductor. It is thereby possible for there to be potential differences between the inner conductor and the outer tube. This may be utilized in particular for a series connection of the inner conductors in order thus to expand the current measurement range.

In one proven embodiment, the interior is designed uniformly and free of partitions. Thus, there is the greatest possible variability when using the interior with different inner conductor primary conductors.

The outer tube primary conductor is advantageously designed such that it has a protuberance pointing into the interior. This protuberance constricts the interior at one point. This is preferably precisely the point at which an (imaginary) additional inner conductor would be arranged (positioning of the protuberance the same way as the inner conductor). This protuberance firstly provides an area with good conductivity and with a large cross section for the outer tube primary conductor, and secondly a screw-on surface with a large surface area is thereby created at the ends of the outer tube primary conductor. This thus constitutes a large-cross-section and thus low-resistance and safe connection option for high-voltage lines supplying and discharging the current. Corresponding connections are preferably provided at both ends of the outer tube primary conductor for the arrangement of the supply or discharge high-voltage lines. The cross section of the protuberance is expediently chosen to be at least as great as that of one of the inner conductor primary conductors. It is thereby ensured that the current is able to be channeled via the protuberance just as well and with the same (or even lower) losses as via the inner conductor primary conductors.

BRIEF DESCRIPTION OF THE FIGURES

The invention is explained in more detail below with reference to the accompanying drawing on the basis of an exemplary embodiment. In the figures.

DETAILED DESCRIPTION OF THE DISCLOSURE

Figure 1:
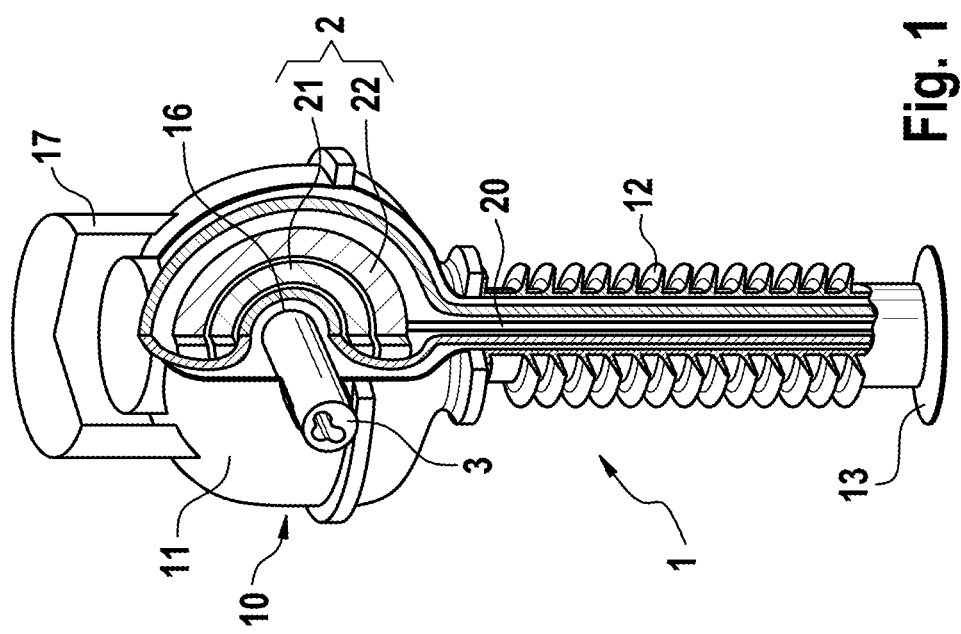
FIG. 1 shows a view of a current transformer with an insulator base and head housing.

A current transformer for high-voltage applications, designated in its entirety by reference numeral 1, is illustrated in a partially sectional illustration in FIG. 1. The current transformer 1 has a transformer head 10 with a housing 11 that is arranged at the upper end of an elongated insulator base 12. A pot 17 is arranged on top of the transformer head 10.

The current transformer 1 is able to be mounted fixedly on a support by way of a flange 13 at the lower end of the insulator base 12. Arranged in the interior of the insulator base 12 is a secondary conductor 20 that channels the signals, received from a measuring core 2 in the transformer head 10, for a measured current to a junction box 14 on the flange 13.

The transformer head 10 has a disk-like shape with a central through-aperture 16. A primary conductor 3 is guided through the through-aperture 16.

A toroidal measurement device 2 is arranged in the transformer head 10 around the through-aperture 16. It is designed in two layers and has two measuring cores 21, 22 that are arranged concentrically around the through-aperture 16. The measuring cores are designed—in a manner known per se—to contactlessly detect the current channeled through the primary conductor 3 and to output a corresponding signal via the signal conductor 20 arranged in the insulator base 12.

The current transformer illustrated in FIG. 1 is an oil-insulated current transformer. The invention may likewise be implemented on a current transformer insulated by way of inert gas. This is illustrated schematically in FIG. 5. In this alternative embodiment, the transformer head 10' is provided with gas insulation instead of the oil insulation. It is seen in this case that the pot 17' has a greater structural height. For the sake of clarity, connection plates for the primary conductor are not illustrated in FIG. 5 or in FIG. 1.

The primary conductor 3 consists of an outer tube primary conductor 30 with an interior 35 in which one or more inner conductor primary conductors 41, 42, 43 are able to be received.

Regardless of the type of insulating medium, the primary conductor 3 must be sealed. For this purpose, a seal 39 is provided at the points at which the outer tube primary conductor 30 enters or exits the transformer head 10. The seal 39 in each case surrounds the primary conductor 30 on its outer circumference.

Figure 2:
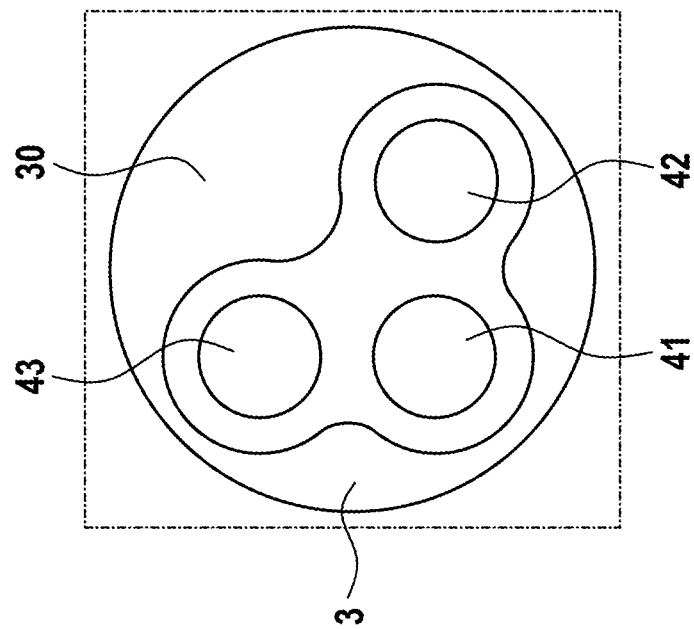
FIG. 2 shows a schematic view of the arrangement of the inner conductors in the outer tube primary conductor (with current density)

The arrangement of the inner conductor primary conductor relative to the outer tube primary conductor is illustrated in FIG. 2. The outer tube primary conductor 30 in which an interior is formed may be seen. The interior is intended to receive three inner conductor primary conductors 41, 42, 43. These are designed as circular rods and are arranged in rounded reception pockets 31, 32, 33 of the interior. In this case, the shape of the reception pockets 31, 32, 33 is matched to the inner conductor primary conductors 41, 42, 43 such that there are essentially uniform distances between the outer circumference of the inner conductor primary conductors 41, 42, 43, on the one hand, and the edge of the interior 35, on the other hand, wherein the distances between two adjacent inner conductor primary conductors 41, 42 and 41, 43 are each twice as great as the distance between inner conductor primary conductors 41, 42, 43 and the edge of the interior 35. A uniform field distribution of the electromagnetic field is thus achieved. The inner conductor primary conductors are air-insulated from the outer tube primary conductor 30 surrounding them.

According to aspects of the invention, the interior 35 is open to the surroundings. The inner conductor primary conductors 41, 42, 43 may thus be inserted into the interior 35 of the outer tube primary conductor 30 without a seal. Retrofitting with inner conductor primary conductors 41, 42, 43 is thus easy and also possible in the field. The only seals are provided on the outside of the outer tube primary conductor 30 and are already inserted in the factory. This results in a robust and easily retrofittable overall construction.

The three inner conductor primary conductors 41, 42, 43 are arranged in a triangular configuration, specifically in such a way that they form corners of a right-angled isosceles triangle. In relation to the cross section of the outer tube primary conductor 30, the triangle formed by the three inner conductor primary conductors 41, 42, 43 is arranged off-center. This thus leaves a space for a protuberance 34 of the outer tube primary conductor 30. This is arranged at the point at which a fourth inner conductor would be arranged in a regular arrangement. The protuberance 34 is designed such that its cross section is at least as great as one of the inner conductor primary conductors 41, 42, 43. In this way, the electrical field that it produces functionally replaces another inner conductor. This thus ultimately results not only in a beneficial field distribution, but also in a beneficial current density distribution. This is indicated in FIG. 2 through different levels of gray shading.

Figure 3B:
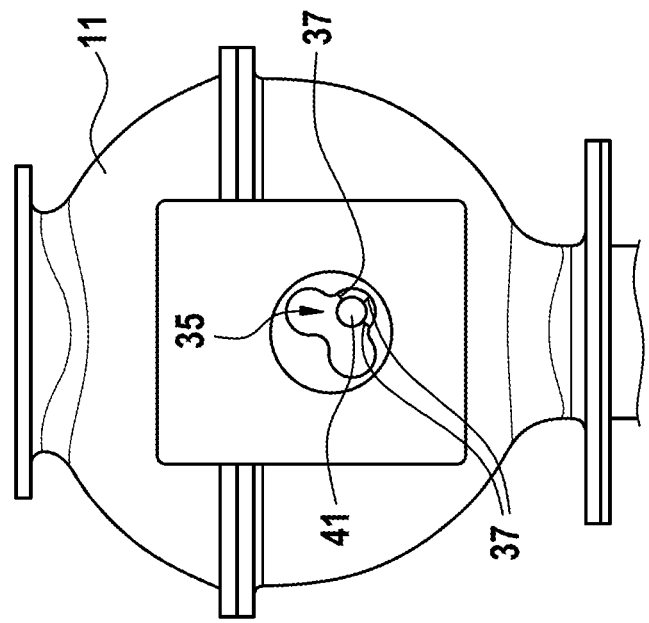
FIGS. 3a-c show front views of the head housing with and without inner conductors.
Figure 3A:
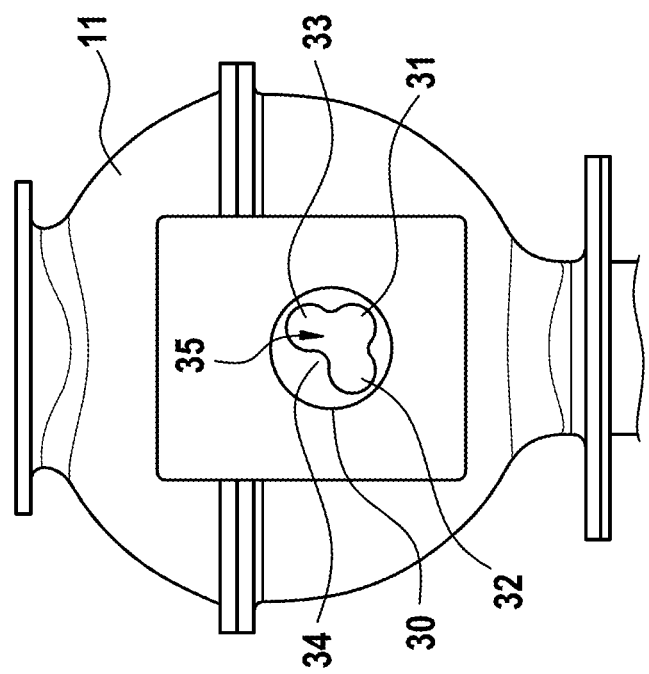
Figure 4A:
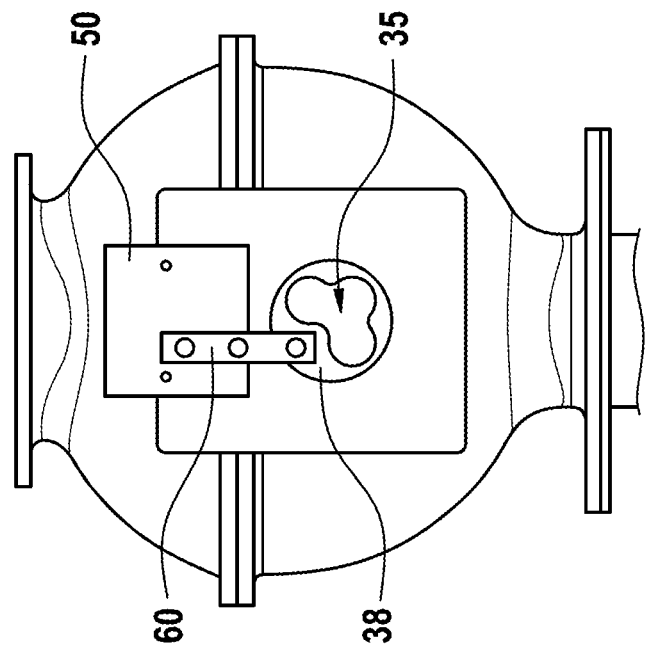
FIGS. 4a-c show front views with mounted inner conductors and their connections.
Figure 3C:
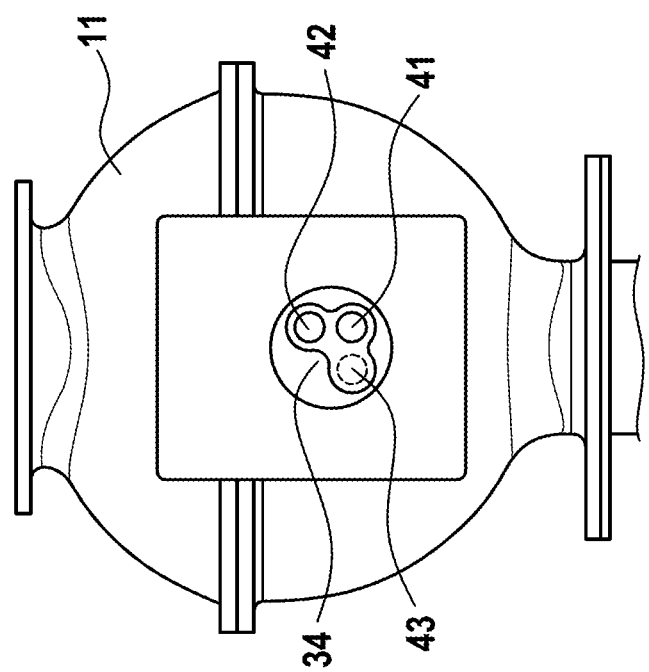
Figure 4C:
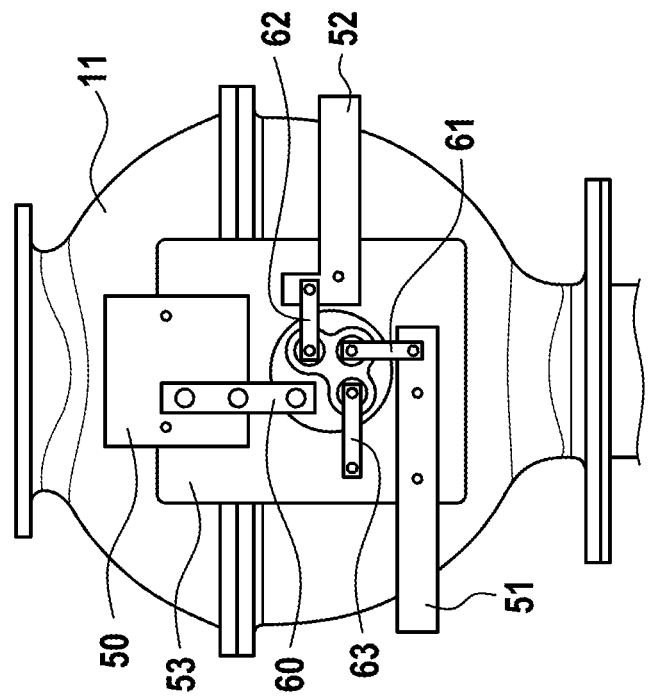
Figure 4B:
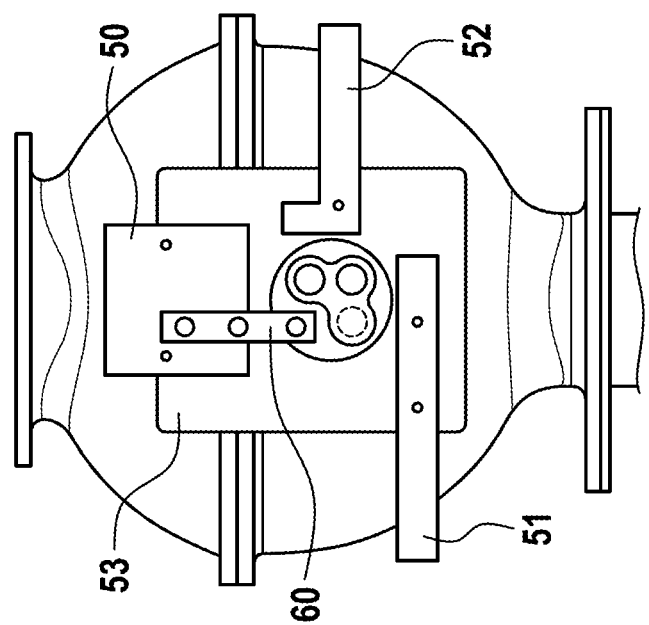
Figure 5:
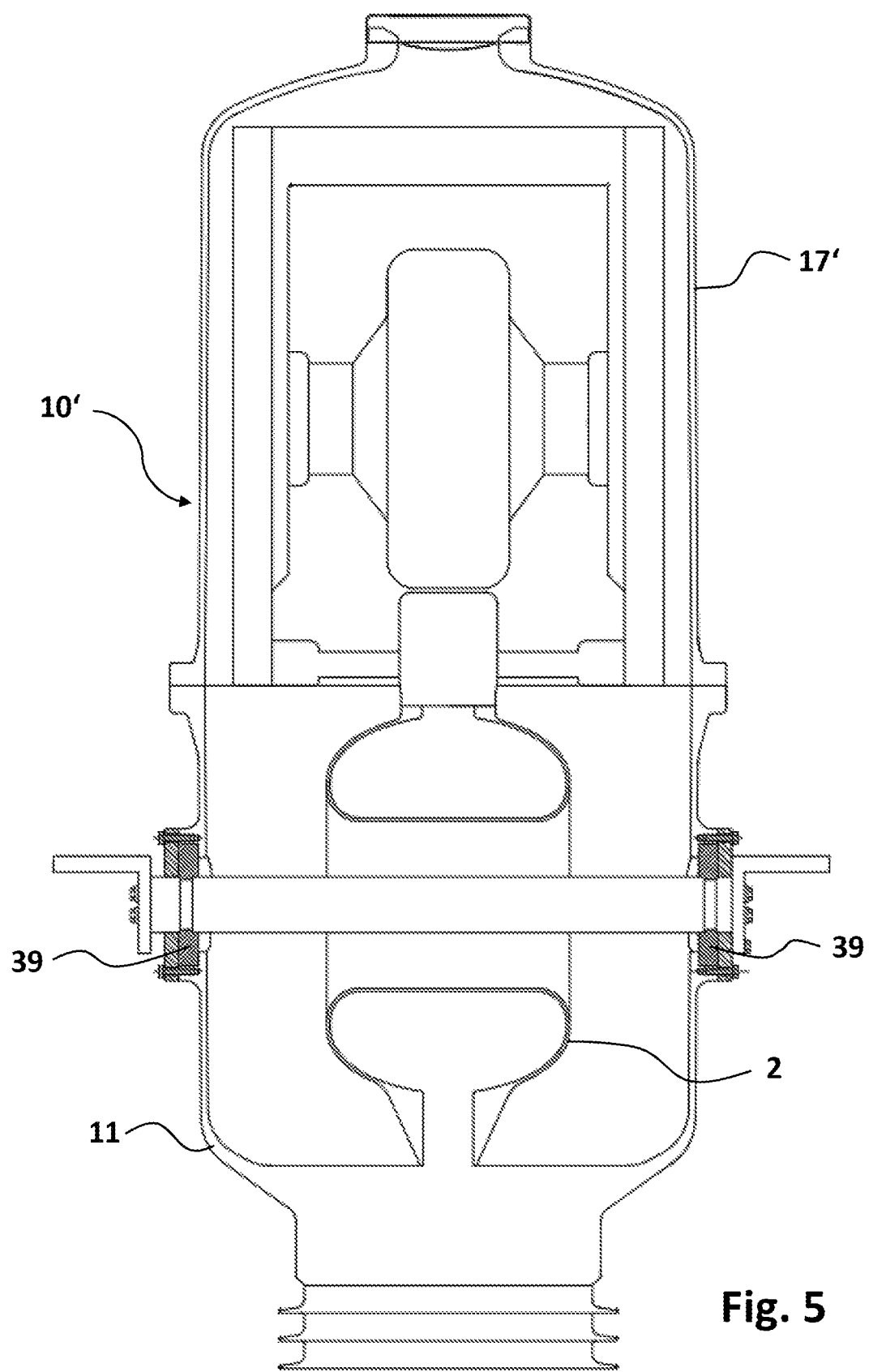
FIG. 5 shows a schematic longitudinal sectional illustration of the head housing of a second exemplary embodiment.

Different arrangement variants of inner conductor primary conductor in the common outer tube primary conductor 30 are illustrated in FIGS. 3 to 5. These each show a partial view of the transformer head, as seen from the axis of the outer tube primary conductor 30. As already explained above, this transformer head has an interior 35 with three pocket-like recesses 31, 32, 33 (reception pockets) for receiving the inner conductor primary conductor. No inner conductor primary conductor is inserted in FIG. 3a. The entire interior 35 thus forms a free space. In contrast thereto, in the illustration according to FIG. 3b, an inner conductor primary conductor 41 is inserted into the free space 35 in a middle one of the receiving pockets 31. In the exemplary embodiment that is illustrated, it is fixed in terms of position in the interior 35 by a plurality of spacers 37. The spacers 37 may be designed as individual elements or as sleeve-like elements. They are expediently not arranged along the entire length of the inner conductor primary conductor 41, but rather preferably only in the region of its two ends. FIG. 3c shows an illustration in which two inner conductor primary conductors 41, 42 are inserted. No spacers are depicted for the sake of clarity. It is seen that the inner conductor primary conductor 42 is arranged in one of the two other pocket-like recesses in the interior 35. A third inner conductor primary conductor 43 that is optionally possibly present is illustrated in dashed lines.

Examples of a connection of the outer tube primary conductor 30 or the inner conductor primary conductors 41, 42, 43 arranged therein are illustrated in FIGS. 4a) to c). FIG. 4a) illustrates the basic case as in FIG. 3a, according to which only the outer tube primary conductor 30 is present. A connection plate 50 that is arranged in an insulated manner on a front side of the transformer head 10 is provided therefor. The connection plate 50 makes contact with the outer tube primary conductor 30 via a connection rail 60. This is connected by way of screw connections to the connection plate 50, on the one hand, and to the outer tube primary conductor 30, on the other hand. For this purpose, a screw-on surface 38 for receiving the screwing mechanism of the connection rail 60 is formed on the outer tube primary conductor 30 in the region of the protuberance 34. An operationally reliable and high-current-capacity connection of the outer tube primary conductor 30 is thereby able to be achieved. A corresponding mirror-image arrangement is provided on the rear side.

In this case, the outer tube is advantageously connected in such a way that the outer tube 30 is connected to the connection plate 50 via the connection rail 60. The outer tube 30 is then the first conductor. This is inserted into the housing 11 in a manner insulated on the input side and screwed conductively to the housing via the contact base plate 53 on the opposite side. The housing 11 is then the first return conductor. Further return conductors, contact brackets 51 and 52 and associated connection plates are mounted in an insulated manner on the contact base plate. Depending on the desired connection variant, they may be connected via the connection rails 61, 62, 63.

If the arrangement according to FIG. 4a) is not sufficient to transmit the currents, then further primary conductors may be inserted according to the invention, specifically as inner conductor primary conductors 41, 42, 43 that may be inserted into the interior 35 of the outer tube primary conductor 30. These are illustrated in FIGS. 4b) and c). In addition to the three inner conductor primary conductors 41, 42, 43, a contact base plate 53 and contact brackets 51, 52 may also additionally be seen. The latter are designed in such a way that they run around the outside of the transformer head 10 so as thus to connect the front and rear sides thereof to one another. The contact brackets 51, 52 are individually connected to a respective one of the inner conductor primary conductors 41, 42, 43 by way of correspondingly associated connection rails 61, 62, 63. A series connection of the inner conductor primary conductors 41, 42, 43 with the inclusion of the outer tube primary conductor 30 may thereby be achieved. The measurement range is thereby expanded to smaller currents (more precisely quadrupled).

A schematic sectional illustration is depicted in FIG. 5. As already mentioned, this is an embodiment with an inert gas-insulated transformer head 7. The outer tube primary conductor 30 with its seals 39, which outer tube primary conductor is guided through a central opening in the toroidal measurement device 2, may be clearly seen. The interior of the transformer head 10' with the toroidal measurement device 2 is insulated by oil paper or gas-insulated, in particular by sulfur hexafluoride SF6. Inner conductor primary conductors are not present in this figure; if necessary, they may be inserted into the interior of the outer tube primary conductor 30 without additional seals being required according to the invention, since their sealing is taken over centrally by the outer tube primary conductor 30.

The invention claimed is:

1. A current transformer with fluid or oil paper insulation for a high voltage, comprising a head housing that is passed through by a primary conductor, wherein a measurement device penetrated by the primary conductor is arranged in the head housing,
    wherein the primary conductor comprises two different types, an outer tube primary conductor as a first type and one or more inner conductor primary conductors as a second type, wherein the outer tube primary conductor defines an interior that is configured to removably receive the one or more inner conductor primary conductors, wherein the interior of the outer tube primary conductor is open to surroundings enabling retrofitting of the one or more inner conductor primary conductors, and wherein the one or more inner conductor primary conductors are configured to be removably inserted into the interior.

2. The current transformer of claim 1, wherein a plurality of reception pockets are formed in the interior, and wherein the reception pockets position the one or more inner conductor primary conductors in the interior.

3. The current transformer of claim 2, wherein spacers are provided for the reception pockets.

4. The current transformer of claim 1, wherein the one or more inner conductor primary conductors are arranged uniformly distributed in a circumferential direction.

5. The current transformer of claim 4, wherein three inner conductor primary conductors are arranged at corners of a right-angled isosceles triangle.

6. The current transformer of claim 1, wherein the outer tube primary conductor is insulated from the head housing on only one side.

7. The current transformer of claim 6, wherein the outer tube primary conductor is connected conductively to the head housing on another side.

8. The current transformer of claim 1, wherein the one or more inner conductor primary conductors are insulated from the outer tube primary conductor.

9. The current transformer of claim 1, wherein the one or more inner conductor primary conductors are mounted in the interior without seals.

10. The current transformer of claim 1, wherein the outer tube primary conductor has a protuberance pointing into the interior.

11. The current transformer of claim 10, wherein the protuberance has a cross section that is at least as great as a cross section of the one or more inner conductor primary conductors.

12. The current transformer of claim 10, wherein the protuberance is positioned the same way as the one or more inner conductor primary conductors.

13. The current transformer of claim 10, wherein connections for high-voltage conductors are provided on the outer tube primary conductor at both ends and the connections are configured as screw-on surfaces on the protuberance.

14. The current transformer of claim 1, wherein connections for high-voltage conductors are provided on the outer tube primary conductor at both ends.

15. The current transformer of claim 1, wherein the one or more inner conductor primary conductors are air-insulated.

\* \* \* \* \*